(12) United States Patent
Atherton

(10) Patent No.: US 7,939,866 B2
(45) Date of Patent: May 10, 2011

(54) FIELD EFFECT TRANSISTOR

(75) Inventor: John Stephen Atherton, Darlington (GB)

(73) Assignee: RFMD (UK) Limited, Newton Aycliffe (GB)

( * ) Notice: Subject to any disclaimer, the term of this patent is extended or adjusted under 35 U.S.C. 154(b) by 443 days.

(21) Appl. No.: 12/124,783

(22) Filed: May 21, 2008

(65) Prior Publication Data

US 2009/0020793 A1 Jan. 22, 2009

(30) Foreign Application Priority Data

May 21, 2007 (GB) .................................. 0709706.6

(51) Int. Cl.
*H01L 29/78* (2006.01)
(52) U.S. Cl. ................ 257/288; 257/401; 257/E29.229; 257/E29.23
(58) Field of Classification Search .................. 257/288, 257/401, E29.229, E29.23
See application file for complete search history.

(56) References Cited

U.S. PATENT DOCUMENTS

| | | | | |
|---|---|---|---|---|
| 3,449,648 A | * | 6/1969 | Beale et al. | 257/401 |
| 3,586,930 A | * | 6/1971 | Das et al. | 257/401 |
| 4,005,467 A | * | 1/1977 | Vergnolle | 257/276 |
| 5,313,083 A | * | 5/1994 | Schindler | 257/280 |
| 6,501,136 B1 | | 12/2002 | Lin | |
| 2006/0022218 A1 | | 2/2006 | Masumoto et al. | |

FOREIGN PATENT DOCUMENTS

| | | |
|---|---|---|
| EP | 0373803 A3 | 6/1990 |
| EP | 0802571 A3 | 10/1997 |

OTHER PUBLICATIONS

Certified GB0709706.6 dated Mar. 25, 2008 and being sent via U.S. Postal Service.
Search Report dated Mar. 18, 2008; Application No. GB0709706.6.

* cited by examiner

*Primary Examiner* — Evan Pert
(74) *Attorney, Agent, or Firm* — Winthrow & Terranova, P.L.L.C.

(57) ABSTRACT

A transistor includes a first electrode on a substrate, wherein the first electrode comprises a bus bar and has first and second first electrode fingers extending therefrom, the fingers being spaced apart to define a channel therebetween. The transistor also includes a second electrode on the substrate having a second electrode finger spaced apart from the first electrode and extending along the channel to define a gate region between the fingers. The gate region comprises a "curved" portion beyond the end of the second electrode finger proximate to the bus bar of the first electrode and a gate electrode extends along the gate region, through the "curved" gate portion. The substrate further comprises an active layer beneath the gate region, characterized in that the active layer extends beyond the end of the second electrode finger beneath the "curved" portion of the gate region.

6 Claims, 4 Drawing Sheets

US 7,939,866 B2

FIELD EFFECT TRANSISTOR

The subject patent application claims priority to and all the benefits of United Kingdom Patent Application No. 0709706.6, which was filed on 21 May 2007 with The UK Patent Office.

The present invention relates to a Field Effect Transistor (FET). More particularly, but not exclusively, the present invention relates to a FET having a meandering gate region between interdigitated source and drain fingers, the active layer of the FET extending beneath the whole of the gate region, including the curved portions of the gate region beyond the ends of the electrode fingers.

Field Effect Transistors having interdigitated source and drain fingers on a semiconductor substrate are known. The fingers define a meandering gate region comprising a plurality of straight portions connected together by curved portions. A gate electrode extends along the gate region. The semiconductor substrate comprises an active layer beneath the source and drain fingers and extending therebetween under the straight portions of the gate region.

The active layer extends only under the straight portions of the meandering gate region. This is an inefficient use of semiconductor area increasing the area of the FET on the substrate for a given gate length.

The present invention seeks to overcome this problem. Accordingly, the present invention provides a Field Effect Transistor comprising a substrate comprising a semiconductor layer;

a first electrode on the substrate, the first electrode comprising a bus bar and having first and second first electrode fingers extending therefrom, the fingers being spaced apart to define a receiving channel therebetween;

a second electrode on the substrate having a second electrode finger spaced apart from the first electrode and extending along the receiving channel to define a gate region between the fingers, the gate region comprising a curved portion beyond the end of the second electrode finger proximate to the bus bar of the first electrode;

a gate electrode extending along the gate region, through the curved gate portion;

the substrate further comprising an active layer beneath the gate region, the active layer being adapted to change between on and off states on application of a voltage to the gate electrode;

characterised in that the active layer extends beyond the end of the second electrode finger beneath the curved portion of the gate region.

The first electrode can be a source and the second electrode can be a drain.

Alternatively, the first electrode can be a drain and the second electrode can be a source.

Preferably, each of the first and second electrodes comprises a plurality of electrode fingers, the fingers of the first and second electrodes being interdigitated to define a meandering gate region therebetween having a plurality of curved portions.

The substrate can further comprise a cap layer arranged between the first and second electrodes and the semiconductor layer.

Preferably, the cap layer comprises an aperture extending through the cap layer to the semiconductor layer, the gate being disposed within the aperture.

In a further aspect of the invention there is provided a semiconductor wafer comprising a plurality of Field Effect Transistors each Field Effect Transistor comprising a substrate comprising a semiconductor layer;

a first electrode on the substrate, the first electrode comprising a bus bar and having first and second first electrode fingers extending therefrom, the fingers being spaced apart to define a receiving channel therebetween;

a second electrode on the substrate having a second electrode finger spaced apart from the first electrode and extending along the receiving channel to define a gate region between the fingers, the gate region comprising a curved portion beyond the end of the second electrode finger proximate to the bus bar of the first electrode;

a gate electrode extending along the gate region, through the curved gate portion;

the substrate further comprising an active layer beneath the gate region, the active layer being adapted to change between on and off states on application of a voltage to the gate electrode;

characterised in that the active layer extends beyond the end of the second electrode finger beneath the curved portion of the gate region.

The present invention will now be described by way of example only and not in any limitative sense with reference to the accompanying drawings in which FIG. 1 shows a portion of a known Field Effect Transistor in plan view;

Figure 1:
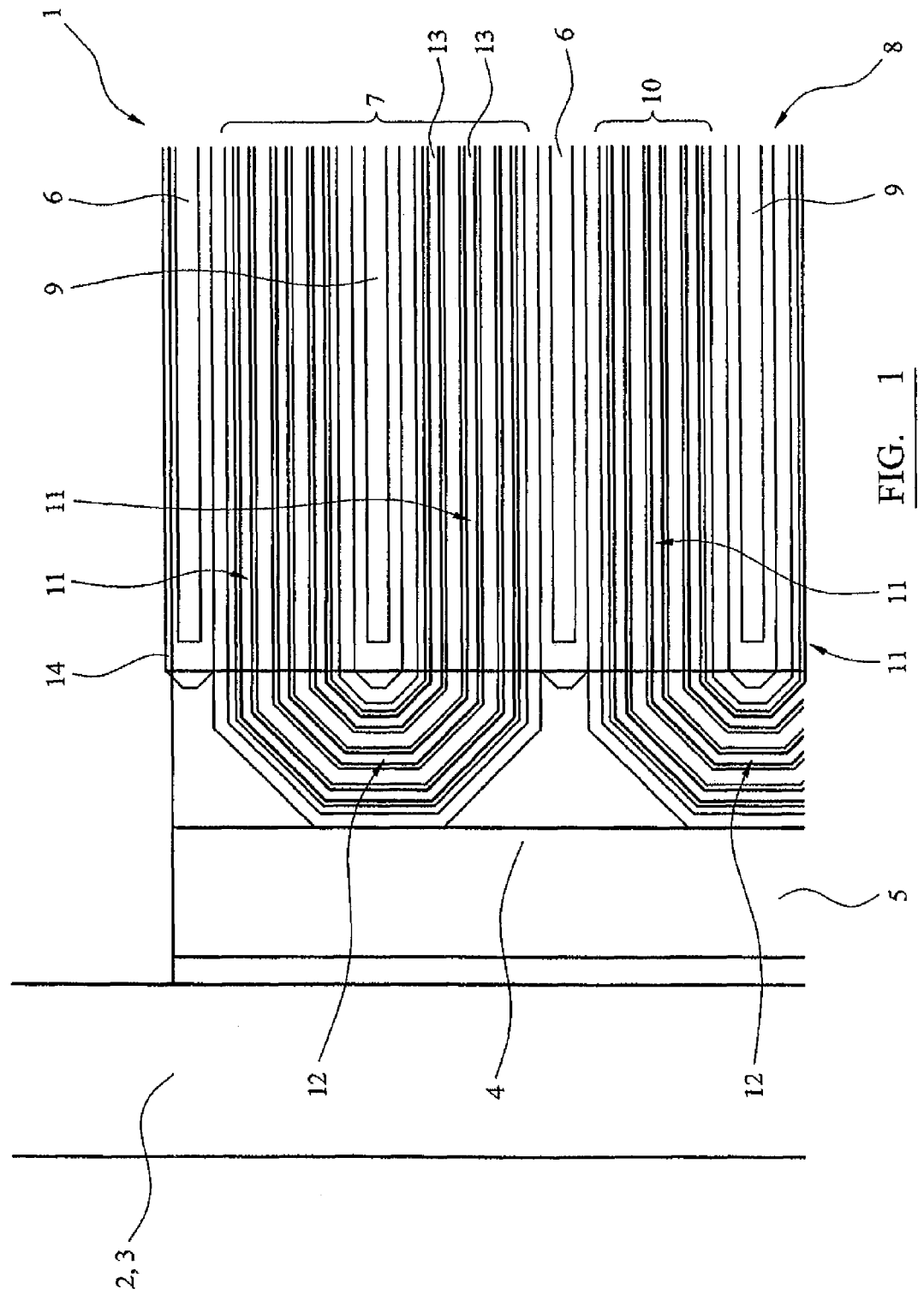

FIG. 1 shows a known Field Effect Transistor (FET) 1 according to the invention. The FET 1 comprises a substrate 2 comprising a semiconductor layer 3. On the semiconductor layer 3 is a source electrode 4 comprising a bus bar 5 and a plurality of spaced apart source fingers 6 defining a plurality of receiving channels 7 therebetween. The transistor 1 further comprises a drain electrode 8 having a plurality of drain fingers 9. The source and drain fingers 6,9 are interdigitated with a drain finger 9 in each receiving channel 7 as shown.

The source and drain electrode fingers 6, 9 between them define a meandering gate region 10. The meandering gate region 10 comprises a plurality of straight portions 11 between the sides of the electrode fingers 6, 9. The straight portions 11 are connected together by curved portions 12 beyond the ends of the electrode fingers 6, 9 as shown.

Extending along the meandering gate region 10 are a plurality of gate electrodes 13.

The substrate 2 comprises an active layer 14. Typically, this comprises a low bandgap strained quantum well sandwiched between two high bandgap semiconductor layers. As is shown, the active gate 14 is arranged within the substrate 2 beneath the source, drain and gate electrodes 6,9,13. The active layer 14 can be changed between on and off states by application of a voltage to the gate electrodes 13 so controlling the current flow between source and drain electrodes 4, 8. The operation of such field effect transistors 1 is known and will not be discussed in detail.

As can be seen from FIG. 1, the active layer 14 only extends below the straight portions 11 of the meandering gate region 10. The gate electrodes 13 in the curved portion region 12 are therefore ineffective in controlling current flow between source electrode 4 and drain electrode 8. This does not make optimum use of the area of the substrate 2.

Figure 2:
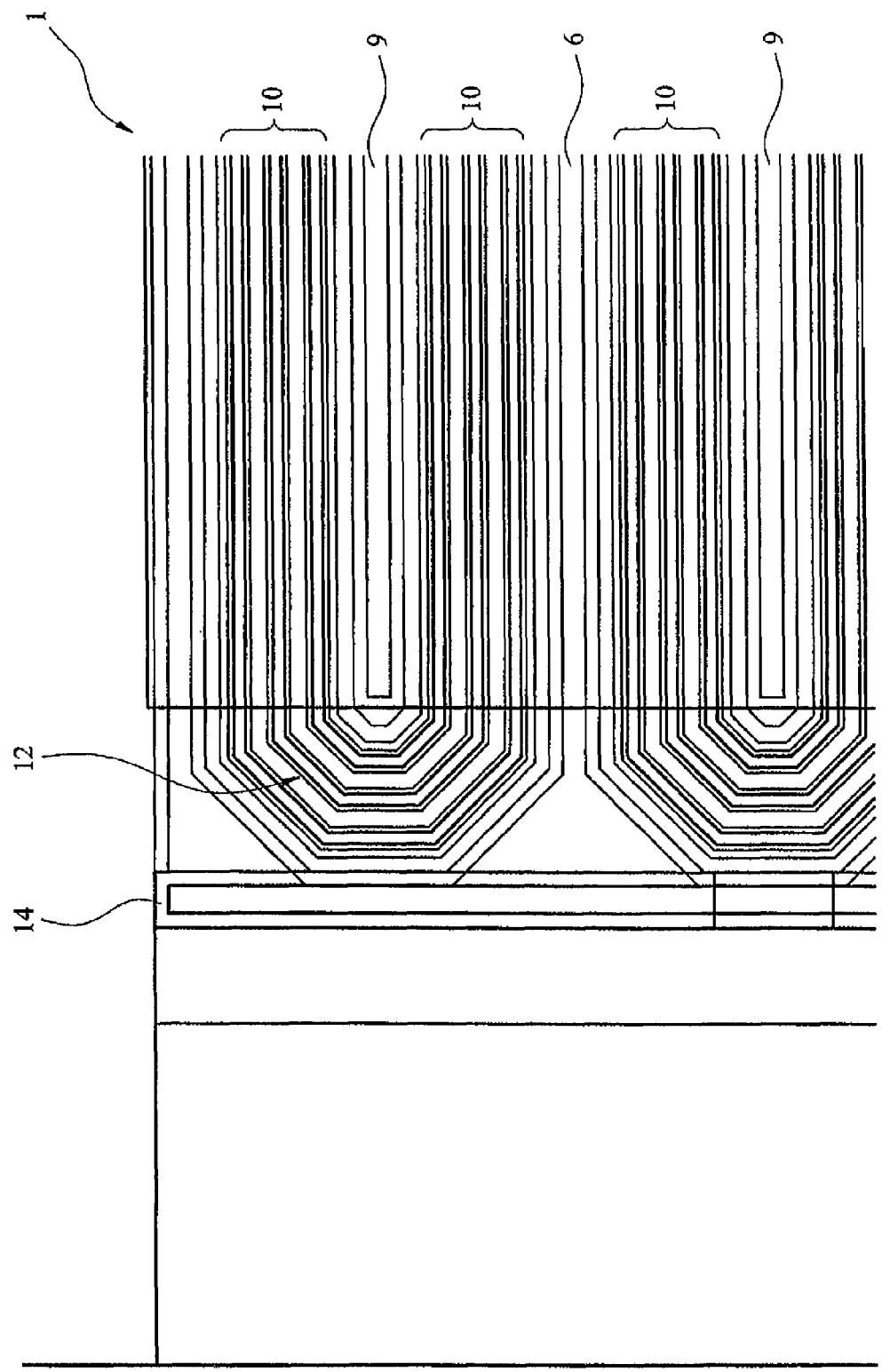
FIG. 2 shows a portion of a Field Effect Transistor according to the invention in plan view.

Shown in FIG. 2 is a portion of a field effect transistor 1 according to the invention in plan view. In this embodiment the active layer 14 extends below the entire meandering gate region 10, including the curved portions 12 of the gate region 10 beyond the ends of the electrode fingers 6, 9. The transistor according to the invention is more difficult to manufacture than known transistors as control of the photolithography, etch and metal deposition needs to be maintained around the curved portion of the gate region as well as in the straight portions. However, this results in a significant reduction in substrate area required by the transistor, particularly when the transistor employs a plurality of gate electrodes.

Figure 3:
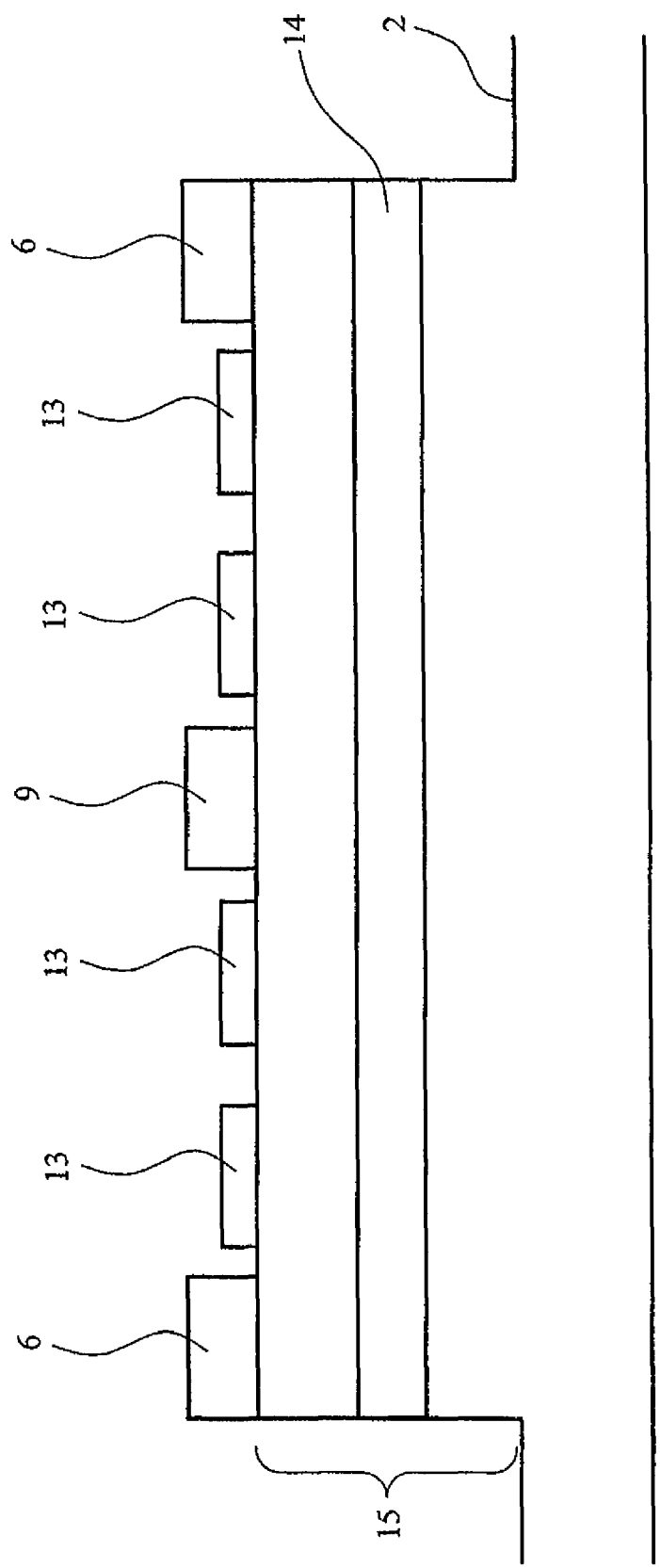
FIG. 3 shows a Field Effect Transistor according to the invention in cross section.

Shown in FIG. 3 is an embodiment of a field effect transistor 1 according to the invention in cross section. The semiconductor substrate 2 comprises a mesa 15 upstanding from the remainder of the substrate 2. The mesa 15 is created by partially etching through a starting semiconductor wafer including the active layer 14 as shown. Etching through the active layer 14 isolates the resulting transistor 1 from the adjacent components (not shown) on the substrate 2. The source and drain fingers 6, 9 are deposited on a semiconductor layer of the substrate 2. The gate electrodes 13 are deposited therebetween. FIG. 3 shows a transistor 1 having one drain finger 9 two source fingers 6 and two gate electrodes. Other similar embodiments having larger numbers of source and drain fingers 6, 9 are of course possible.

Figure 4:
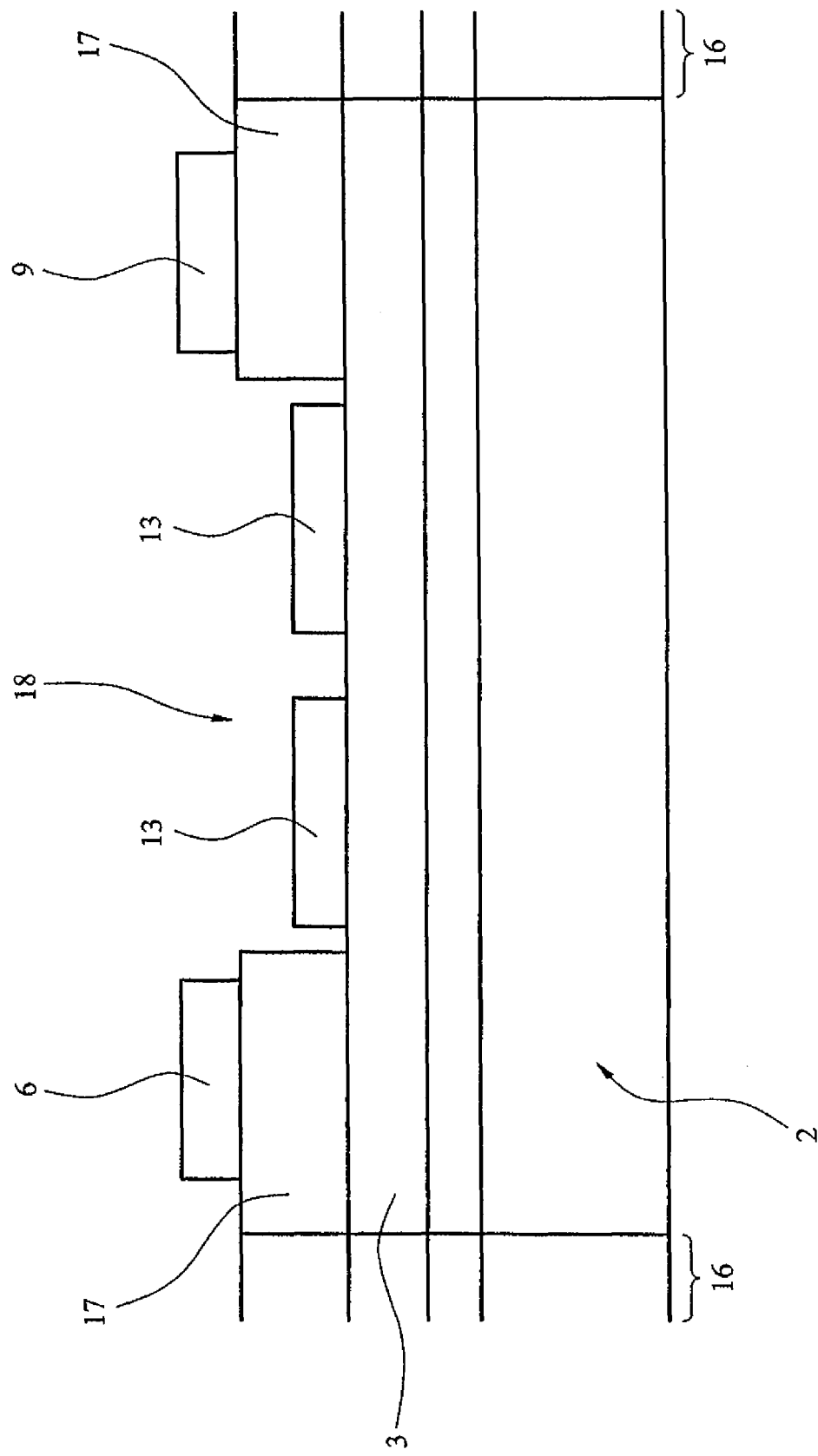
FIG. 4 shows a further embodiment of a Field Effect Transistor according to the invention in cross section.

Shown in FIG. 4 is a further embodiment of a field effect transistor 1 according to the invention. In this embodiment the transistor 1 is isolated from surrounding components by ion implantation of the portion 16 of the substrate 2. The substrate 2 further comprises a highly doped cap layer 17. The source and drain fingers 6, 9 form low resistance ohmic contacts with the cap layer 17. An aperture 18 extends through the cap layer 17 to the semiconductor layer 3 below. The gate electrode 13 is deposited through the aperture 18 on the semiconductor layer 3.

In all of the above embodiments the substrate 2 is shown in a schematic form comprising a semiconductor layer 3 and an active layer 14. Modern field effect transistors are complex multilayered semiconductor structures. It is to be understood that such structures are considered to be within the scope of the invention.

The active layer 14 can be a delta doped layer sandwiched between semiconductor layers within the substrate. Alternatively, the active layer 14 can be a thicker layer of uniform or graded doping. The active layer 14 may form one face of the substrate 2 with the gate electrode 13 directly on the active layer 14.

What is claimed is:

1. A Field Effect Transistor comprising:
   a substrate comprising a semiconductor layer;
   a first electrode on the substrate, the first electrode comprising a bus bar and having first and second first electrode fingers extending therefrom, the fingers being spaced apart to define a receiving channel therebetween;
   a second electrode on the substrate having a second electrode finger spaced apart from the first electrode and extending along the receiving channel to define a gate region between the fingers, the gate region comprising a curved portion bent and free of a right angle in plan view beyond the end of the second electrode finger proximate to the bus bar of the first electrode;
   a gate electrode extending along the gate region, through the curved gate portion;
   the substrate further comprising an active layer beneath the gate region, the active layer being adapted to change between on and off states on application of a voltage to the gate electrode;
   characterised in that the active layer extends beyond the end of the second electrode finger beneath the curved portion of the gate region.

2. A Field Effect Transistor as claimed in claim 1, wherein the first electrode is a source and the second electrode is a drain.

3. A Field Effect Transistor as claimed in claim 1, wherein the first electrode is a drain and the second electrode is a source.

4. A Field Effect Transistor as claimed in claim 1, wherein each of the first and second electrodes comprises a plurality of electrode fingers, the fingers of the first and second electrodes being interdigitated to define a meandering gate region therebetween having a plurality of curved portions.

5. A Field Effect Transistor as claimed in claim 1, wherein the substrate further comprises a cap layer arranged between the first and second electrodes and the semiconductor layer.

6. A Field Effect Transistor as claimed in claim 5, the cap layer comprising an aperture extending through the cap layer to the semiconductor layer, the gate being disposed within the aperture.

* * * * *